United States Patent
Karpov et al.

(10) Patent No.: US 11,404,639 B2
(45) Date of Patent: Aug. 2, 2022

(54) SELECTOR DEVICES WITH INTEGRATED BARRIER MATERIALS

(71) Applicant: Intel Corporation, Santa Clara, CA (US)

(72) Inventors: Elijah V. Karpov, Portland, OR (US); Brian S. Doyle, Portland, OR (US); Prashant Majhi, San Jose, CA (US); Abhishek A. Sharma, Hillsboro, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 770 days.

(21) Appl. No.: 16/114,713

(22) Filed: Aug. 28, 2018

(65) Prior Publication Data

US 2020/0075851 A1 Mar. 5, 2020

(51) Int. Cl.
*H01L 45/00* (2006.01)
*H01L 27/24* (2006.01)

(52) U.S. Cl.
CPC ...... *H01L 45/1246* (2013.01); *H01L 27/2481* (2013.01); *H01L 45/06* (2013.01); *H01L 45/08* (2013.01); *H01L 45/10* (2013.01); *H01L 45/1233* (2013.01)

(58) Field of Classification Search
CPC . H01L 45/1246; H01L 45/1233; H01L 45/06; H01L 45/08; H01L 45/10; H01L 27/2481
See application file for complete search history.

(56) References Cited

U.S. PATENT DOCUMENTS

| 10,114,590 B1* | 10/2018 | Wicklein | H01L 45/147 |
| 2013/0082232 A1* | 4/2013 | Wu | H01L 45/1246 |
| | | | 257/E47.001 |
| 2017/0288140 A1* | 10/2017 | Karpov | H01L 27/2436 |

FOREIGN PATENT DOCUMENTS

| WO | WO-2016048330 A1 * | 3/2016 | H01L 27/2409 |
| WO | WO-2018152697 A1 * | 8/2018 | H01L 27/02 |
| WO | WO-2019066828 A1 * | 4/2019 | H01L 27/224 |

* cited by examiner

*Primary Examiner* — Marvin Payen
(74) *Attorney, Agent, or Firm* — Patent Capital Group

(57) ABSTRACT

Disclosed herein are selector devices and related devices and techniques. For example, in some embodiments, a selector device may include a first electrode, a second electrode, and a selector material stack between the first electrode and the second electrode. The selector material stack may include a dielectric material layer between a first conductive material layer and a second conductive material layer. A first material layer may be present between the first electrode and the first conductive material layer, and a second material layer may be present between the first conductive material layer and the dielectric layer. The first material layer and the second material layer may be diffusion barriers, and the second material layer may be a weaker diffusion barrier than the first material layer.

25 Claims, 3 Drawing Sheets

SELECTOR DEVICES WITH INTEGRATED BARRIER MATERIALS

BACKGROUND

A selector device is a two-terminal device exhibiting a volatile change in resistance. In an off state, a selector device may exhibit high resistance; in an on state, a selector device may exhibit low resistance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
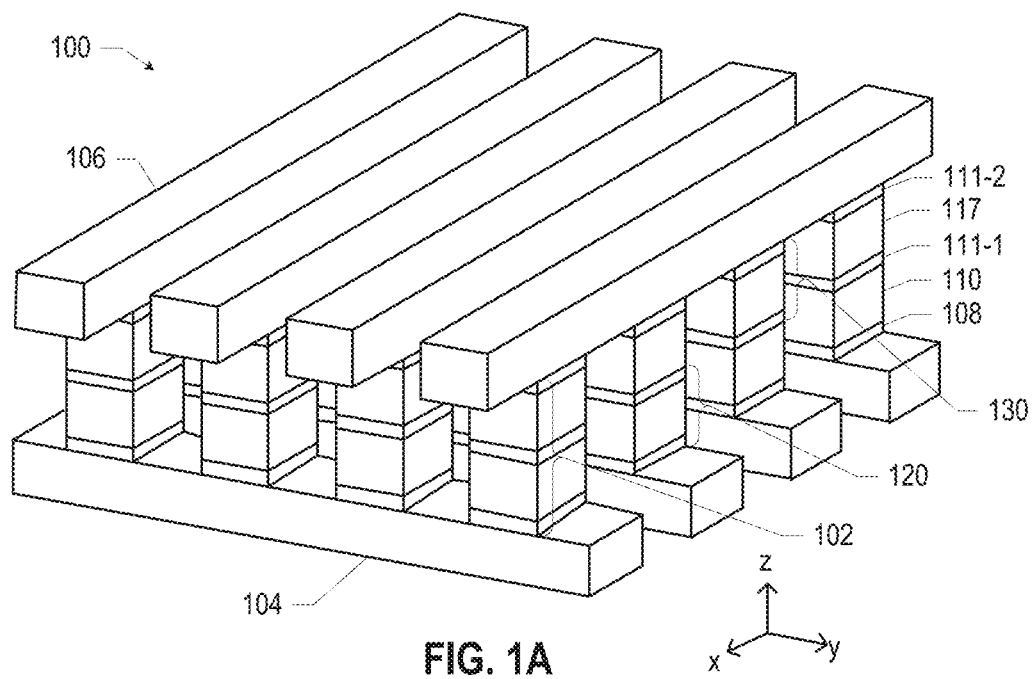
FIG. 1A is a perspective view of a portion of a memory array including a selector device with integrated barrier materials, in accordance with various embodiments.

Disclosed herein are selector devices and related devices and techniques. For example, in some embodiments, a selector device may include a first electrode, a second electrode, and a selector material stack between the first electrode and the second electrode. The selector material stack may include a dielectric material layer between a first conductive material layer and a second conductive material layer. A first material layer may be present between the first electrode and the first conductive material layer, and a second material layer may be present between the first conductive material layer and the dielectric layer. The first material layer and the second material layer may be diffusion barriers, and the second material layer may be a weaker diffusion barrier than the first material layer.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). As used herein, the notation "A/B/C" means (A), (B), and/or (C). The term "between," when used with reference to measurement ranges, is inclusive of the ends of the measurement ranges. As used herein, the terms "strong barrier material" and "weak barrier material" are used to indicate the relative strength of these different materials as diffusion barriers between materials on either side of the barrier materials. For example, in a material stack in which a strong barrier material is between material A and material B, and a weak barrier material is between material C and material D, the strong barrier material limits diffusion between materials A and B to a greater degree than the weak barrier material limits diffusion between materials C and D. Some embodiments may include only one or more strong barrier materials, or only one or more weak barrier materials; in such embodiments, the terms "strong" and "weak" are used for continuity and convenience in the present specification.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

FIG. 1A is a perspective view of a portion of a memory array 100 including a selector device 130 with integrated barrier materials, in accordance with various embodiments. The memory array 100 may be a cross-point array including memory cells 102 located at the intersections of conductive lines 104 and conductive lines 106. In some embodiments, the conductive lines 104 may be word lines and the conductive lines 106 may be bit lines, for example; for ease of discussion, this terminology may be used herein to refer to the conductive lines 104 and the conductive lines 106. In the embodiment illustrated in FIG. 1A, the word lines 104 may be parallel to each other and may be arranged perpendicularly to the bit lines 106 (which themselves may be parallel to each other), but any other suitable arrangement may be used. The word lines 104 and/or the bit lines 106 may be formed of any suitable conductive material, such as a metal (e.g., tungsten, copper, titanium, or aluminum). In some embodiments, the memory array 100 depicted in FIG. 1A may be a portion (e.g., a level) of a three-dimensional array in which other memory arrays like the memory array 100 of FIG. 1A are located at different levels (e.g., above or below the memory array 100).

Each memory cell 102 may include a storage element 120 coupled in series with an associated selector device 130. Generally, a storage element 120 may be programmed to a target data state (e.g., corresponding to a particular resistance state) by applying an electric field or energy (e.g., positive or negative voltage or current pulses) to the storage element 120 for a particular duration. In some embodiments, a storage element 120 may include a memory material 110 disposed between a pair of electrodes 108 and 111-1. The storage element 120 may be, for example, a resistive storage element (also referred to herein as a "resistive switch") that, during operation, switches between two different non-volatile states: a high resistance state (HRS) and a low resistance state (LRS). The state of a resistive storage element may be used to represent a data bit (e.g., a "1" for HRS and a "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

The storage element 120 may be, for example, a resistive random access memory (RRAM) device; in such embodiments, the memory material 110 may include an oxygen exchange layer (e.g., hafnium) and an oxide layer, as known in the art. The storage element 120 may be, for example, a metal filament memory device (e.g., a conductive bridging random access memory (CBRAM) device); in such embodiments, the memory material 110 may include a solid electrolyte, one of the electrodes 108 and 111-1 may be an electrochemically active material (e.g., silver or copper), and the other of the electrodes 108 and 111-1 may be an inert material (e.g., an inert metal), as known in the art. A chemical barrier layer (e.g., tantalum, tantalum nitride, or tungsten) may be disposed between the electrochemically active electrode and the solid electrolyte to mitigate diffusion of the electrochemically active material into the solid electrolyte, in some such embodiments. In some embodiments, the storage element 120 may be a phase change memory (PCM) device; in such embodiments, the memory material 110 may include a chalcogenide or other phase change memory material. In some embodiments, the storage element 120 may be a magnetoresistive random access memory (MRAM) device; in such embodiments, the electrodes 108 and 111-1 may be magnetic (e.g., ferromagnetic), and the memory material 110 may be a thin tunnel barrier material. As known in the art, MRAM devices may operate on the principle of tunnel magnetoresistance between two magnetic layers (the electrodes 108 and 111-1) separated by a tunnel junction (the memory material 110). An MRAM device may have two stable states: when the magnetic moments of the two magnetic layers are aligned parallel to each other, an MRAM device may be in the LRS, and when aligned antiparallel, an MRAM device may be in the HRS.

The selector device 130 may be a two-terminal device that may act as a bipolar switch, controlling the flow of current through the storage element 120. In some embodiments, the selector device 130 may include a selector material stack 117 disposed between a pair of electrodes 111-1 and 111-2. Note that, in the embodiment illustrated in FIG. 1A, the electrode 111-1 of the selector device 130 is "shared" with the storage element 120 in that the electrode 111-1 acts as an electrode for the selector device 130 and for the storage element 120. In other embodiments of the memory cell 102, the selector device 130 may not share any electrodes with the storage element 120. During manufacture of the memory cell 102, the selector device 130 may be fabricated before or after the storage element 120 is fabricated. Various embodiments of the selector device 130 are discussed in detail below.

Figure 1B:
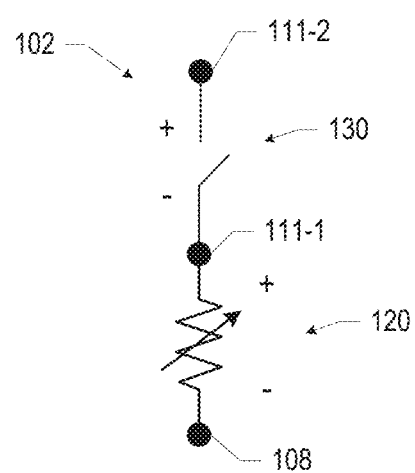
FIG. 1B is a schematic illustration of a memory cell of the memory array of FIG. 1A, in accordance with various embodiments.

As illustrated in the schematic view in FIG. 1B of the memory cell 102, when the selector device 130 is in a conductive (i.e., low resistance) state, the "switch" may be closed; when the selector device 130 is in a non-conductive (i.e., high resistance) state, the "switch" may be open. The state of the selector device 130 may change in response to the voltage applied across the selector device 130. For example, the selector device 130 may be in an HRS (an "off state") when the voltage across the selector device 130 increases from zero to the threshold voltage Von. When the voltage across the selector device 130 reaches and exceeds the threshold voltage Von (and an associated on stage current Ion), the selector device 130 may enter an LRS (an "on state") and may conduct current of a positive polarity. When the voltage across the selector device 130 is decreased from the threshold voltage Von, the selector device 130 may remain in the on stage until a holding voltage Vhold (and an associated holding current Ihold) is reached. When the voltage across the selector device 130 decreases to and beyond the holding voltage Vhold, the selector device 130 may enter the off state again. In some embodiments, the selector devices 130 disclosed herein may have a threshold voltage Von between 0.4 volts and 2.5 volts, or 1 volt or less. In some embodiments, the selector devices 130 disclosed herein may have an on stage current Ion that is greater than or equal to 0.5 mega amperes per square centimeter. In some embodiments, the selector devices 130 disclosed herein may have a holding voltage Vhold between 0.1 volts and 2.5 volts (e.g., between 0.1 volts and 1 volt for embedded applications, and between 0.5 volts and 2 volts for standalone applications).

Disclosed herein are selector devices 130 having a selector material stack 117 that includes one or more barrier material layers. A barrier material layer in the selector material stack 117 may reduce diffusion between materials on either side of the barrier material layer, improving the performance and useful life of the selector device 130 and the integrated circuit (IC) component in which the selector device 130 is included. For example, some of the selector devices 130 disclosed herein may include a strong barrier material layer 112 (discussed in further detail below) between an electrode 111 of the selector device 130 and a proximate conductive material layer 113 of the selector material stack (e.g., a silver layer). In some previous selector devices, metal from a conductive material layer may undesirably diffuse into the electrode during operation, and further undesirably diffuse into adjacent structures, contaminating these structures. This contamination may result in compromised performance, shorter useful life, increased (and undesirable) performance variability over time as diffusion occurs, and poor thermal stability (since the rate of diffusion may change depending on the local temperature). The strong barrier material layers 112 disclosed herein may be conductive (so as to allow current to flow through the selector device 130, as discussed above) but may also limit diffusion of the material of the conductive material layer 113 into the proximate electrode 111, resulting in improved characteristics relative to previous selector devices.

Some of the selector devices 130 disclosed herein may include a weak barrier material layer 114 (discussed in further detail below) between a conductive material layer 113 and a proximate dielectric material layer 115 (e.g., an oxide layer). The weak barrier material layer 114 may allow some desirable diffusion of the metal of the conductive material layer 113 into the dielectric material layer 115, but may desirably reduce the total amount of diffusion that occurs relative to some previous selector devices, in which no barrier between a conductive material layer and a dielectric material layer may be present and the selector device fails when all or nearly all of the metal of the conductive material layer diffuses into the dielectric material layer. The weak barrier material layers 114 disclosed herein may be conductive (so as to allow current to flow through the selector device 130, as discussed above) but may also help control diffusion of the material of the conductive material layer 113 into the proximate dielectric material layer 115, resulting in improved characteristics relative to previous selector devices.

Figure 2:
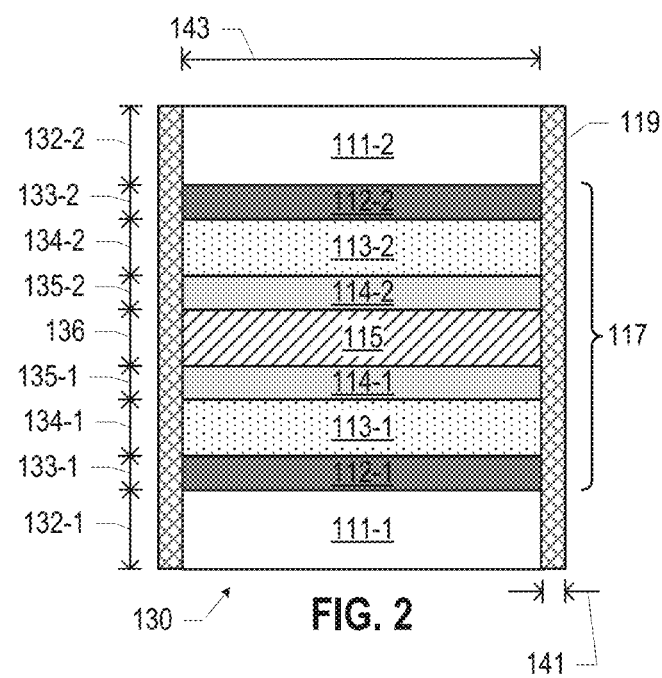
FIG. 2 is a cross-sectional view of an example selector device with integrated barrier materials, in accordance with various embodiments.

The selector devices 130 disclosed herein, and the associated memory cells 102, may take any of a number of forms. For example, FIG. 2 is a cross-sectional view of a selector device 130, in accordance with various embodiments. The selector device 130 of FIG. 2 may include an electrode 111-1, an electrode 111-2, and a selector material stack 117 between the electrodes 111-1 and 111-2. The electrodes 111-1 and 111-2 may have the same material composition or different material compositions, and the thickness 132-1 of the electrode 111-1 may be the same or different than the thickness 132-2 of the electrode 111-2. In embodiments in which the selector device 130 is to be operated in both a "positive" and a "negative" direction (e.g., as discussed above with reference to FIG. 1B), it may be desirable for the electrodes 111-1 and 111-2 to have the same material composition, and the same thicknesses 132-1 and 132-2. The following description may refer generally to an electrode 111, and the electrodes 111-1 and 111-2 may take any of the forms described herein with respect to the electrode 111.

The selector material stack 117 may include a conductive material layer 113-1 between the electrode 111-1 and a dielectric material layer 115, and a conductive material layer 113-2 between the dielectric material layer 115 and the electrode 111-2. The conductive material layers 113-1 and 113-2 may have the same material composition or different material compositions, and the thickness 134-1 of the conductive material layer 113-1 may be the same or different than the thickness 134-2 of the conductive material layer 113-2. In embodiments in which the selector device 130 is to be operated in both a "positive" and a "negative" direction (e.g., as discussed above with reference to FIG. 1B), it may be desirable for the conductive material layers 113-1 and 113-2 to have the same material composition, and the same thicknesses 134-1 and 134-2. The following description may refer generally to a conductive material layer 113, and the conductive material layers 113-1 and 113-2 may take any of the forms described herein with respect to the conductive material layer 113.

Selector devices 130 that include a dielectric material layer 115 between conductive material layers 113 may be referred to as compositional insulator-to-metal-transition (IMT) selector devices. Such selector devices may exhibit higher Ion to Ioff ratios, and lower operating voltages, than other types of selectors. The selector devices 130 disclosed herein may be advantageously utilized in memory devices (as discussed elsewhere herein) such as transistor-less memory arrays, hybrid phase transition field effect transistors (phaseFETs), logic devices, and other applications.

The selector material stack 117 may include a strong barrier material layer 112-1 between the electrode 111-1 and a conductive material layer 113-1, and a strong barrier material layer 112-2 between the conductive material layer 113-2 and the electrode 111-2. As noted above, the strong barrier material layer 112-1 (112-2) may limit diffusion between the electrode 111-1 (111-2) and the conductive material layer 113-1 (113-2). The strong barrier material layers 112-1 and 112-2 may have the same material composition or different material compositions, and the thickness 133-1 of the strong barrier material layer 112-1 may be the same or different than the thickness 133-2 of the strong barrier material layer 112-2. In embodiments in which the selector device 130 is to be operated in both a "positive" and a "negative" direction (e.g., as discussed above with reference to FIG. 1B), it may be desirable for the strong barrier material layers 112-1 and 112-2 to have the same material composition, and the same thicknesses 133-1 and 133-2. The following description may refer generally to a strong barrier material layer 112, and the strong barrier material layers 112-1 and 112-2 may take any of the forms described herein with respect to the strong barrier material layer 112.

The selector material stack 117 may include a weak barrier material layer 114-1 between the conductive material layer 113-1 and the dielectric material layer 115, and a weak barrier material layer 114-2 between the dielectric material layer 115 and the conductive material layer 113-2. As noted above, the weak barrier material layer 114-1 (114-2) may allow some diffusion between the conductive material layer 113-1 (113-2) and the dielectric material layer 115, but may prevent or slow the complete diffusion of the metal of the conductive material layer 113-1 (113-2) into the dielectric material layer 115. The weak barrier material layers 114-1 and 114-2 may have the same material composition or different material compositions, and the thickness 135-1 of the weak barrier material layer 114-1 may be the same or different than the thickness 135-2 of the weak barrier material layer 114-2. In embodiments in which the selector device 130 is to be operated in both a "positive" and a "negative" direction (e.g., as discussed above with reference to FIG. 1B), it may be desirable for the weak barrier material layers 114-1 and 114-2 to have the same material composition, and the same thicknesses 135-1 and 135-2. The following description may refer generally to a weak barrier material layer 114, and the weak barrier material layers 114-1 and 114-2 may take any of the forms described herein with respect to the weak barrier material layer 114.

In some embodiments, a selector material stack 117 may include the strong barrier material layers 112-1 and 112-2, but may not include the weak barrier material layers 114-1 and 114-2. In some other embodiments, a selector material stack 117 may include the weak barrier material layers 114-1 and 114-2 and the strong barrier material layers 112-1 and 112-2.

The electrodes 111-1 and 111-2 may include any suitable material. In some embodiments, an electrode 111 may include tantalum, platinum, hafnium, cobalt, indium, iridium, copper, tungsten, ruthenium, palladium, and/or carbon. An electrode 111 may include pure forms of these elements, combinations of these elements, or combinations of these elements and other elements, in some embodiments.

For example, in some embodiments, an electrode 111 may include a conductive nitride (e.g., tantalum nitride or titanium nitride).

The conductive material layers 113-1 and 113-2 may include any suitable material. In some embodiments, a conductive material layer 113 may include silver, copper, cobalt, nickel, or gold. A conductive material layer 113 may be composed of pure forms of these materials, combinations of these materials, or combinations of these materials and other elements, in various embodiments.

The dielectric material layer 115 may include any suitable material. In some embodiments, the dielectric material layer 115 may include niobium, tantalum, vanadium, titanium, or hafnium. For example, the dielectric material layer 115 may be an oxide material (e.g., niobium oxide, tantalum oxide, vanadium oxide, titanium oxide, or hafnium oxide) that may be capable of undergoing an insulator-to-metal transition in response to an applied voltage or resistance. For example, the dielectric material layer 115 may be $TaO_{0.5-1.7}$ (e.g., $TaO_{1.5}$). In some embodiments, the dielectric material layer 115 may be a non-oxide material. For example, the dielectric material layer 115 may be a chalcogenide material, a multi-component material including group IV or group VI elements, such as silicon and tellurium. Examples of chalcogenides that may serve as the dielectric material layer 115 in the selector material stack 117 may include germanium silicon selenium, germanium silicon tellurium, and silicon tellurium arsenic germanium, among others.

The strong barrier material layers 112-1 and 112-2 may include any suitable material. In some embodiments, a strong barrier material layer 112 may include an oxide, such as indium oxide, ruthenium oxide, tungsten oxide, or molybdenum oxide. In some embodiments, a strong barrier material layer 112 may include a nitride, such as titanium nitride, tantalum nitride, or tungsten nitride. In some embodiments, a strong barrier material layer 112 may include a carbide, such as titanium carbide, tantalum carbide, tungsten carbide, or a refractory metal carbide. In some embodiments, a strong barrier material layer 112 may include a carbonitride, such as tantalum carbonitride. In some embodiments, a strong barrier material layer 112 may include a metal (e.g., a pure metal), such as tantalum. In some embodiments in which the strong barrier material layer 112 includes pure tantalum, the thickness 133 of the strong barrier material layer 112 may advantageously be greater than 3 nanometers to achieve a good barrier against diffusion. More generally, the thickness 133 of a strong barrier material layer 112 may be between 3 nanometers and 10 nanometers.

The weak barrier material layers 114-1 and 114-2 may include any suitable material. In some embodiments, a weak barrier material layer 114 may include any of the materials discussed above with reference to the strong barrier material layer 112, but may have a sufficiently small thickness 135 so that some amount of diffusion between the adjacent conductive material layer 113 and dielectric material layer 115 may occur. For example, a weak barrier material layer 114 may include any of the materials discussed above with reference to the strong barrier material layer 112, and may have a thickness 135 that is less than 3 nanometers. In some embodiments, a weak barrier material layer 114 may include titanium or aluminum.

In some embodiments, a weak barrier material layer 114 may be selected so that the solubility of the material of the adjacent conductive material layer 113 in the weak barrier material layer 114 is between 1% and 30%. For example, in some embodiments in which the conductive material layer 113 includes silver, the adjacent weak barrier material layer 114 may include tellurium. In another example, in some embodiments in which the conductive material layer 113 includes cobalt, the adjacent weak barrier material layer 114 may include carbon (which may allow approximately 1% of the cobalt to be dissolved in the carbon, and thus may sustain a cobalt filament in the dielectric material layer 115). In some embodiments in which the conductive material layer 113 has a solubility in the adjacent weak barrier material layer 114 between 1% and 30%, the thickness 135 of the adjacent weak barrier material layer 114 may be between 1 nanometer and 10 nanometers.

Figure 3A:
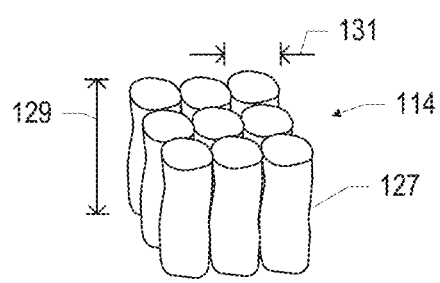
FIGS. 3A and 3B are various views of an example weak barrier material having a columnar microstructure, in accordance with various embodiments.
Figure 3B:
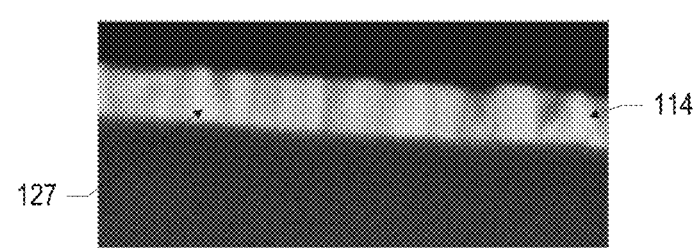

In some embodiments, a weak barrier material layer 114 may be a material having a columnar microstructure. The spaces between the columns in the microstructure of such a weak barrier material layer 114 may allow a limited amount of diffusion between the adjacent conductive material layer 113 and the adjacent dielectric material layer 115. FIG. 3A is a perspective view of a weak barrier material layer 114 having a columnar microstructure, and FIG. 3B is an example image providing a cross-sectional side view of a weak barrier material layer 114. A weak barrier material layer 114 having a columnar microstructure may have columnar grain boundaries, as illustrated in FIGS. 3A and 3B. Individual columnar grains 127 may be roughly parallel to each other, and may have a height 129 (in the direction of the thickness 135) and a diameter 131. The height 129 of the columnar grains 127 may be on the order of the diameter 131 of the columnar grains. For example, columnar grains 127 that have a height 129 of approximately 10 nanometers (e.g., when the thickness 135 is approximately 10 nanometers) may have a diameter 131 of approximately 10 nanometers. In another example, columnar grains 127 that have a height 129 of approximately 50 nanometers (e.g., when the thickness 135 is approximately 50 nanometers) may have a diameter 131 of approximately 20 nanometers. Some examples of materials having a columnar microstructure that may be suitable for use as a weak barrier material layer 114 may include aluminum or titanium, in various embodiments. In some embodiments in which the weak barrier material layer 114 has a columnar microstructure, the thickness 135 of the weak barrier material layer 114 may be between 5 nanometers and 100 nanometers.

FIG. 2 also illustrates an outer barrier material 119 surrounding the selector material stack 117 and the electrodes 111. The outer barrier material 119 may be part of the selector device 130, and may act as a diffusion barrier between the selector material stack 117 and the surrounding materials (e.g., in a memory array 100 or other IC component). The outer barrier material 119 may not be conductive, but may instead electrically insulate the selector material stack 117 and the electrodes 111 from other materials in the x-y direction, as shown. The outer barrier material 119 may include any suitable material. For example, in some embodiments, the outer barrier material 119 may include a dielectric nitride, such as silicon nitride. In some embodiments, the outer barrier material 119 may include a dielectric oxide, such as aluminum oxide (formed, e.g., by atomic layer deposition (ALD)). In some embodiments, a selector device 130 may not include an outer barrier material 119.

The dimensions of the materials included in the selector device 130 of FIG. 2 may take any suitable values. For example, in some embodiments, the electrode 111-1 (111-2) may have a thickness 132-1 (132-2) between 1 nanometer and 100 nanometers. In some embodiments, the conductive material layer 113-1 (113-2) may have a thickness 134-1 (134-2) between 1 nanometer and 10 nanometers. In some embodiments, the dielectric material layer 115 may have a thickness 136 between 2 nanometers and 30 nanometers. In some embodiments, the cross-sectional width 143 of the selector material stack 117 may be between 5 nanometers and 100 nanometers. In some embodiments, a thickness 141 of the outer barrier material 119 may be between 10 nanometers and 100 nanometers; while greater thicknesses 141 may provide more robust electrical insulation, greater thicknesses 141 may also limit the achievable pitch between adjacent ones of the selector devices 130.

Figure 4:
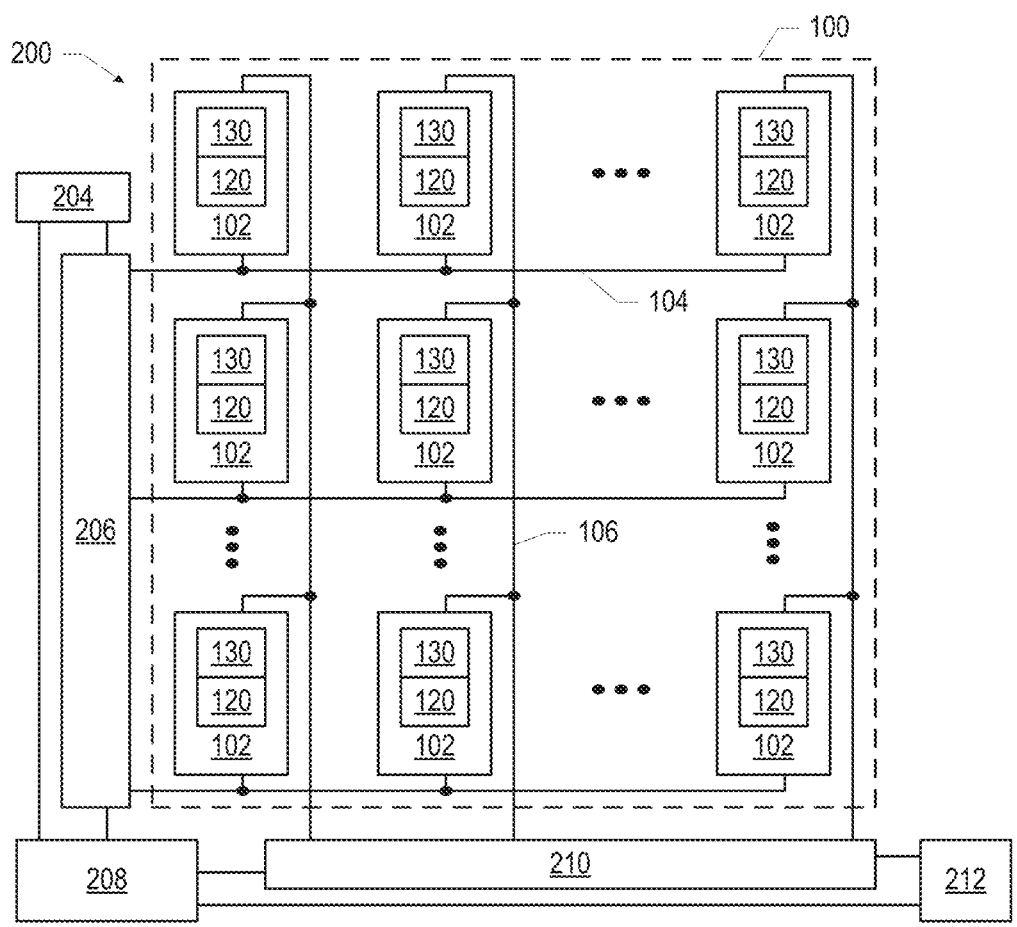
FIG. 4 is a schematic illustration of a memory device including selector devices with integrated barrier materials, in accordance with various embodiments.

A memory array 100 including a selector device 130 may be controlled in any suitable manner. For example, FIG. 4 is a schematic illustration of a memory device 200 including a memory array 100 having memory cells 102 with storage elements 120 and selector devices 130, in accordance with various embodiments. The selector devices 130 of FIG. 4 may include integrated barrier material layers in accordance with any of the embodiments disclosed herein. As discussed above, each memory cell 102 may include a storage element 120 connected in series with any of the embodiments of the selector devices 130 disclosed herein. The memory device 200 of FIG. 4 may be a bidirectional cross-point array in which each column is associated with a bit line 106 driven by column select circuitry 210. Each row may be associated with a word line 104 driven by row select circuitry 206. During operation, read/write control circuitry 208 may receive memory access requests (e.g., from one or more processing devices or communication chips of a computing device, such as the computing device 2000 discussed below), and may respond by generating an appropriate control signal (e.g., read, write 0, or write 1), as known in the art. The read/write control circuitry 208 may control the row select circuitry 206 and the column select circuitry 210 to select the desired memory cell(s) 102. Voltage supplies 204 and 212 may be controlled to provide the voltage(s) necessary to bias the memory array 100 to facilitate the requested action on one or more memory cells 102. Row select circuitry 206 and column select circuitry 210 may apply appropriate voltages across the memory array 100 to access the selected memory cells 102 (e.g., by providing appropriate voltages to the memory cells 102 to allow the desired selector devices 130 to conduct). Row select circuitry 206, column select circuitry 210, and read/write control circuitry 208 may be implemented using any devices and techniques known in the art.

Figure 5:
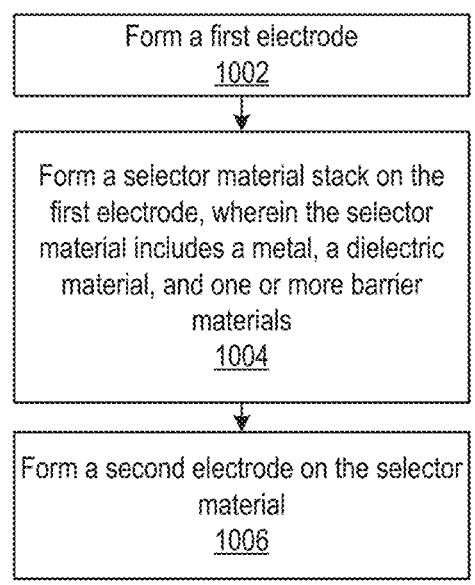
FIG. 5 is a flow diagram of an illustrative method of manufacturing a selector device with integrated barrier materials, in accordance with various embodiments.

Any suitable techniques may be used to manufacture the selector devices 130 and memory cells 102 disclosed herein. FIG. 5 is a flow diagram of an illustrative method 1000 of manufacturing a selector device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable selector device (including any suitable ones of the embodiments disclosed herein).

At 1002, a first electrode may be formed (e.g., by physical vapor deposition (PVD), such as sputtering). For example, the electrode 111-1 may be formed on the memory material 110 of a storage element 120. The first electrode may take any of the forms disclosed herein.

At 1004, a selector material stack may be formed on the first electrode. The selector material stack may include a metal, a dielectric material, and one or more barrier material layers. For example, the selector material stack 117 may be formed on the electrode 111-1, may include a conductive material layer 113 and a dielectric material layer 115, and may also include a strong barrier material layer 112 and/or a weak barrier material layer 114, as discussed above. The selector material stack may take any of the forms disclosed herein.

Any suitable technique may be used to form the selector material stack at 1004. In some embodiments, a PVD technique (e.g., sputtering) may be used to form one or more layers of the selector material stack. In some embodiments, an ALD technique may be used to form one or more layers of the selector material stack (e.g., in combination with the use of a PVD technique). The PVD or ALD technique may be followed by an annealing operation. In some embodiments, both ALD and PVD may be used for various layers in the selector material stack.

At 1006, a second electrode may be formed on the selector material stack. For example, the electrode 111-2 may be formed on the selector material stack 117. The second electrode may take any of the forms disclosed herein.

Figure 6:
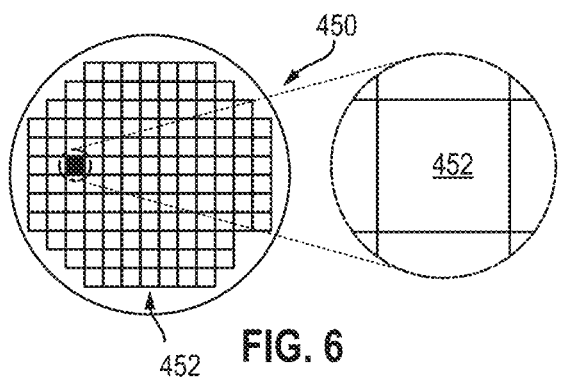
FIG. 6 depicts top views of a wafer and dies that may include any of the selector devices or memory cells disclosed herein.

The selector devices 130 and memory cells 102 disclosed herein may be included in any suitable electronic device. FIG. 6 depicts top views of a wafer 450 and dies 452 that may be formed from the wafer 450; the dies 452 may include any of the selector devices 130 or memory cells 102 disclosed herein. The wafer 450 may include semiconductor material and may include one or more dies 452 having IC elements (e.g., selector devices 130 and storage elements 120) formed on a surface of the wafer 450. Each of the dies 452 may be a repeating unit of a semiconductor product that includes any suitable device (e.g., the memory device 200). After the fabrication of the semiconductor product is complete, the wafer 450 may undergo a singulation process in which the dies 452 are separated from one another to provide discrete "chips" of the semiconductor product. A die 452 may include one or more selector devices 130 or memory cells 102 and/or supporting circuitry to route electrical signals to the selector devices 130 or memory cells 102 (e.g., interconnects including conductive lines 104 and 106), as well as any other IC components. In some embodiments, the wafer 450 or the die 452 may include other memory devices, logic devices (e.g., AND, OR, NAND, or NOR gates), or any other suitable circuit element. Multiple ones of these devices may be combined on a single die 452. For example, a memory device formed by multiple memory arrays (e.g., multiple memory arrays 100) may be formed on a same die 452 as a processing device (e.g., the processing device 2002 of FIG. 8) or other logic that is configured to store information in the memory devices or execute instructions stored in the memory array.

Figure 7:
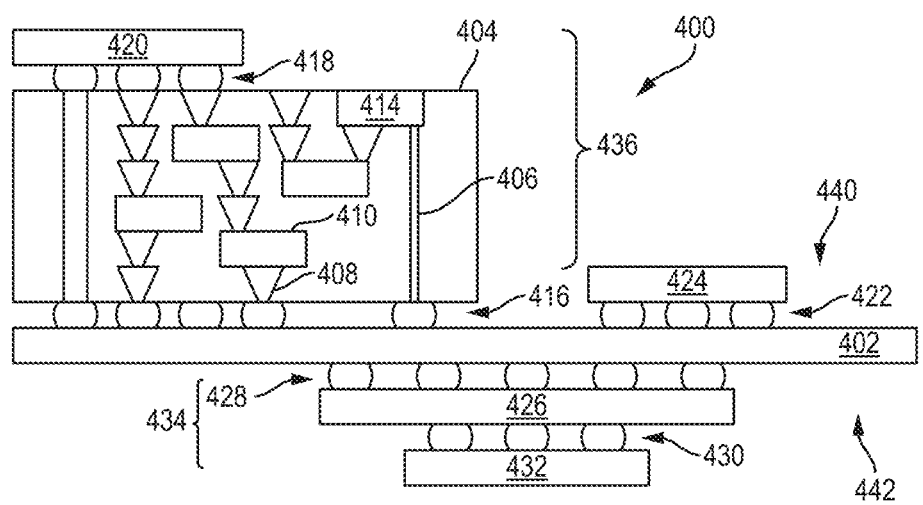
FIG. 7 is a cross-sectional side view of a device assembly that may include any of the selector devices or memory cells disclosed herein.

FIG. 7 is a cross-sectional side view of a device assembly 400 that may include any of the selector devices 130 or memory cells 102 disclosed herein in one or more packages. A "package" may refer to an electronic component that includes one or more IC devices that are structured for coupling to other components; for example, a package may include a die coupled to a package substrate that provides electrical routing and mechanical stability to the die. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 7 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 7, multiple packages may be coupled to the interposer 404; indeed, additional interposers may be coupled to the interposer 404. The interposer 404 may provide an intervening substrate used to bridge the circuit board 402 and the package 420. The package 420 may include one or more selector devices 130 or memory cells 102, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 7, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices (e.g., the selector devices 130 or memory cells 102). More complex devices such as radio frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include one or more selector devices 130 or memory cells 102, for example.

The device assembly 400 illustrated in FIG. 7 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include one or more selector devices 130 or memory cells 102, for example.

Figure 8:
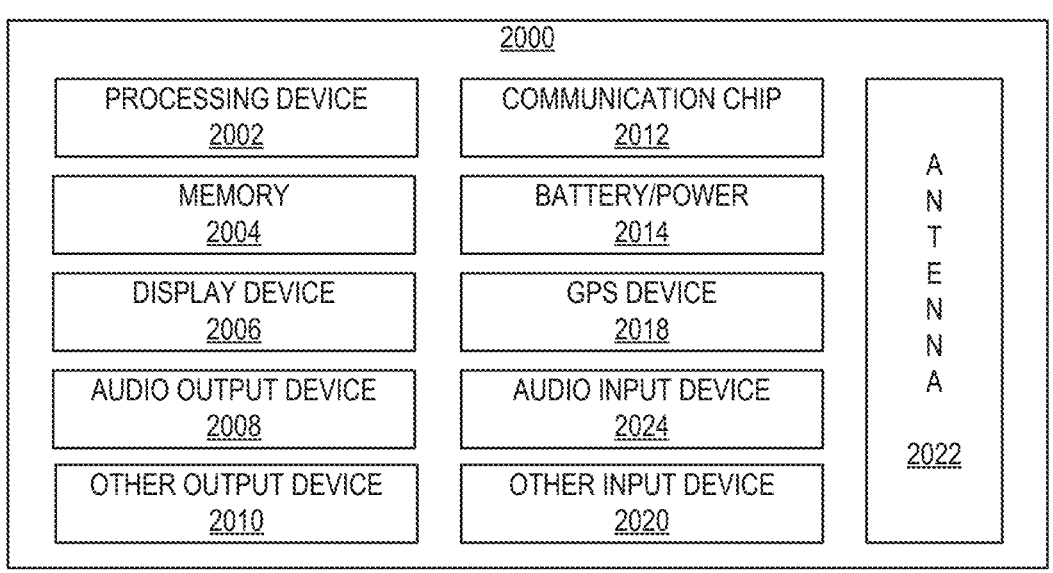
FIG. 8 is a block diagram of an example computing device that may include any of the selector devices or memory cells disclosed herein, in accordance with various embodiments.

FIG. 8 is a block diagram of an example computing device 2000 that may include any of the selector devices 130 or memory cells 102 disclosed herein. A number of components are illustrated in FIG. 8 as included in the computing device 2000, but any one or more of these components may be omitted or duplicated, as suitable for the application. In some embodiments, some or all of the components included in the computing device 2000 may be attached to one or more PCBs (e.g., a motherboard). In some embodiments, various ones of these components may be fabricated onto a single system-on-a-chip (SoC) die. Additionally, in various embodiments, the computing device 2000 may not include one or more of the components illustrated in FIG. 8, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may interface with one or more of the other components of the computing device 2000 (e.g., the communication chip 2012 discussed below, the display device 2006 discussed below, etc.) in a conventional manner. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2000 may include a memory 2004, which may itself include one or more memory devices such as volatile memory (e.g., dynamic random access memory (DRAM)), non-volatile memory (e.g., read-only memory (ROM)), flash memory, solid state memory, and/or a hard drive. The memory 2004 may include one or more selector devices 130 or memory cells 102 or memory arrays 100 or memory devices 200, as disclosed herein. In some embodiments, the memory 2004 may include memory that shares a die with the processing device 2002. This memory may be used as cache memory and may include embedded dynamic random access memory (eDRAM) or spin transfer torque magnetic random access memory (STT-MRAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The computing device 2000 may include an audio output device 2008 (or corresponding interface circuitry, as discussed above). The audio output device 2008 may include any device that generates an audible indicator, such as speakers, headsets, or earbuds.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a GPS device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a selector device, including: a first electrode; a second electrode; and a selector material stack between the first electrode and the second electrode, wherein the selector material stack includes a dielectric material layer between a first conductive material layer and a second conductive material layer, the first conductive material layer is between the first electrode and the dielectric material layer, and the second conductive material layer is between the dielectric material layer and the second electrode; wherein the selector material stack further includes a first material layer between the first electrode and the first conductive material layer, the selector material stack further includes a second material layer between the first conductive material layer and the dielectric material layer, the first material layer has a different material composition from the first electrode and from the first conductive material layer, and the second material layer has a different material composition from the first conductive material layer and from the dielectric material layer.

Example 2 includes the subject matter of Example 1, and further specifies that the first material layer and the second material layer are diffusion barriers, and the second material layer is a weaker diffusion barrier than the first material layer.

Example 3 includes the subject matter of any of Examples 1-2, and further specifies that the first material layer includes oxygen.

Example 4 includes the subject matter of Example 3, and further specifies that the first material layer further includes indium, ruthenium, tungsten, or molybdenum.

Example 5 includes the subject matter of any of Examples 1-2, and further specifies that the first material layer includes nitrogen.

Example 6 includes the subject matter of Example 5, and further specifies that the first material layer further includes titanium, tantalum, or tungsten.

Example 7 includes the subject matter of any of Examples 1-2, and further specifies that the first material layer includes carbon.

Example 8 includes the subject matter of Example 7, and further specifies that the first material layer further includes titanium, tantalum, tungsten, or a refractory metal.

Example 9 includes the subject matter of Example 7, and further specifies that the first material layer further includes nitrogen.

Example 10 includes the subject matter of Example 9, and further specifies that the first material layer further includes tantalum.

Example 11 includes the subject matter of any of Examples 1-2, and further specifies that the first material layer includes tantalum.

Example 12 includes the subject matter of Example 11, and further specifies that the first material layer is a metal.

Example 13 includes the subject matter of any of Examples 1-12, and further specifies that the second material layer has a thickness that is less than 3 nanometers.

Example 14 includes the subject matter of Example 13, and further specifies that the second material layer is tantalum.

Example 15 includes the subject matter of Example 13, and further specifies that the second material layer includes nitrogen.

Example 16 includes the subject matter of Example 15, and further specifies that the second material layer further includes titanium, tantalum, or tungsten.

Example 17 includes the subject matter of Example 13, and further specifies that the second material layer includes carbon.

Example 18 includes the subject matter of Example 17, and further specifies that the second material layer further includes titanium, tantalum, tungsten, or a refractory metal.

Example 19 includes the subject matter of Example 17, and further specifies that the second material layer further includes nitrogen.

Example 20 includes the subject matter of Example 19, and further specifies that the second material layer further includes tantalum.

Example 21 includes the subject matter of any of Examples 1-12, and further specifies that the second material layer includes titanium or aluminum.

Example 22 includes the subject matter of Example 21, and further specifies that the second material layer is a metal.

Example 23 includes the subject matter of any of Examples 1-12, and further specifies that a solubility of material of the first conductive material layer in material of the second material layer is between 1% and 30%.

Example 24 includes the subject matter of Example 23, and further specifies that a thickness of the second material layer is between 1 nanometer and 10 nanometers.

Example 25 includes the subject matter of any of Examples 1-12, and further specifies that the second material layer has a columnar microstructure.

Example 26 includes the subject matter of Example 25, and further specifies that the second material layer has a thickness between 5 nanometers and 100 nanometers.

Example 27 includes the subject matter of any of Examples 1-26, and further specifies that the first conductive material layer and the second conductive material layer have a same thickness.

Example 28 includes the subject matter of any of Examples 1-26, and further specifies that the first conductive material layer includes silver.

Example 29 includes the subject matter of any of Examples 1-26, and further specifies that the first conductive material layer includes copper, cobalt, or nickel.

Example 30 includes the subject matter of any of Examples 1-26, and further specifies that the first conductive material layer and the second conductive material layer have a same material composition.

Example 31 includes the subject matter of any of Examples 1-30, and further specifies that the dielectric material layer includes hafnium, tantalum, niobium, vanadium, or titanium.

Example 32 includes the subject matter of any of Examples 1-30, and further specifies that the dielectric material layer includes oxygen.

Example 33 includes the subject matter of any of Examples 1-30, and further specifies that the dielectric material layer includes a chalcogenide.

Example 34 includes the subject matter of any of Examples 1-30, and further specifies that the first electrode or the second electrode includes tantalum, platinum, hafnium, cobalt, indium, iridium, copper, or tungsten.

Example 35 includes the subject matter of any of Examples 1-34, and further specifies that the selector material stack further includes a third material layer between the dielectric material layer and the second conductive material layer, the selector material stack further includes a fourth material layer between the second conductive material layer and the second electrode, the third material layer has a different material composition from the dielectric material layer and from the second conductive material layer, and the fourth material layer has a different material composition from the second conductive material layer and from the second electrode.

Example 36 includes the subject matter of Example 35, and further specifies that the third material layer has a same material composition as the second material layer.

Example 37 includes the subject matter of any of Examples 35-36, and further specifies that the fourth material layer has a same material composition as the first material layer.

Example 38 includes the subject matter of any of Examples 35-36, and further specifies that the first conductive material layer has a same material composition as the second conductive material layer.

Example 39 includes the subject matter of any of Examples 1-38, and further includes: a dielectric barrier at a side surface of the selector device.

Example 40 includes the subject matter of Example 39, and further specifies that the dielectric barrier includes silicon and nitrogen.

Example 41 includes the subject matter of Example 39, and further specifies that the dielectric barrier includes aluminum and oxygen.

Example 42 includes the subject matter of any of Examples 39-41, and further specifies that the dielectric barrier has a thickness between 10 nanometers and 100 nanometers.

Example 43 is a selector device, including: a first electrode; a second electrode; and a selector material stack between the first electrode and the second electrode, wherein the selector material stack includes a dielectric material layer between a first conductive material layer and a second conductive material layer, the first conductive material layer is between the first electrode and the dielectric material layer, and the second conductive material layer is between the dielectric material layer and the second electrode; wherein the selector material stack further includes a first material layer between the first conductive material layer and the dielectric material layer, the selector material stack further includes a second material layer between the dielectric material layer and the second conductive material layer, the first material layer has a different material composition from the first conductive material layer and from the dielectric material layer, and the second material layer has a different material composition from the dielectric material layer and from the second conductive material layer.

Example 44 includes the subject matter of Example 43, and further specifies that the first material layer has a thickness that is less than 3 nanometers.

Example 45 includes the subject matter of Example 44, and further specifies that the first material layer is tantalum.

Example 46 includes the subject matter of Example 44, and further specifies that the first material layer includes nitrogen.

Example 47 includes the subject matter of Example 46, and further specifies that the first material layer further includes titanium, tantalum, or tungsten.

Example 48 includes the subject matter of Example 44, and further specifies that the first material layer includes carbon.

Example 49 includes the subject matter of Example 48, and further specifies that the first material layer further includes titanium, tantalum, tungsten, or a refractory metal.

Example 50 includes the subject matter of Example 48, and further specifies that the first material layer further includes nitrogen.

Example 51 includes the subject matter of Example 50, and further specifies that the first material layer further includes tantalum.

Example 52 includes the subject matter of Example 43, and further specifies that the first material layer includes titanium or aluminum.

Example 53 includes the subject matter of Example 52, and further specifies that the first material layer is a metal.

Example 54 includes the subject matter of Example 43, and further specifies that a solubility of material of the first conductive material layer in material of the first material layer is between 1% and 30%.

Example 55 includes the subject matter of Example 54, and further specifies that a thickness of the first material layer is between 1 nanometer and 10 nanometers.

Example 56 includes the subject matter of Example 43, and further specifies that the first material layer has a columnar microstructure.

Example 57 includes the subject matter of Example 56, and further specifies that the first material layer has a thickness between 5 nanometers and 100 nanometers.

Example 58 includes the subject matter of any of Examples 43-57, and further specifies that the second material layer has a same material composition as the first material layer.

Example 59 includes the subject matter of any of Examples 43-58, and further specifies that the second material layer has a same thickness as the first material layer.

Example 60 includes the subject matter of any of Examples 43-59, and further specifies that the selector material stack further includes a third material layer between the first electrode and the first conductive material layer, and the third material layer has a different material composition from the first electrode and from the first conductive material layer.

Example 61 includes the subject matter of Example 60, and further specifies that the first material layer and the third material layer are diffusion barriers, and the first material layer is a weaker diffusion barrier than the third material layer.

Example 62 includes the subject matter of any of Examples 60-61, and further specifies that the third material layer includes oxygen.

Example 63 includes the subject matter of Example 62, and further specifies that the third material layer further includes indium, ruthenium, tungsten, or molybdenum.

Example 64 includes the subject matter of any of Examples 60-61, and further specifies that the third material layer includes nitrogen.

Example 65 includes the subject matter of Example 64, and further specifies that the third material layer further includes titanium, tantalum, or tungsten.

Example 66 includes the subject matter of any of Examples 60-61, and further specifies that the third material layer includes carbon.

Example 67 includes the subject matter of Example 66, and further specifies that the third material layer further includes titanium, tantalum, tungsten, or a refractory metal.

Example 68 includes the subject matter of Example 66, and further specifies that the third material layer further includes nitrogen.

Example 69 includes the subject matter of Example 68, and further specifies that the third material layer further includes tantalum.

Example 70 includes the subject matter of any of Examples 60-61, and further specifies that the third material layer includes tantalum.

Example 71 includes the subject matter of Example 70, and further specifies that the third material layer is a metal.

Example 72 includes the subject matter of any of Examples 60-61, and further specifies that the third material layer is a metal.

Example 73 includes the subject matter of any of Examples 60-72, and further specifies that the selector material stack further includes a fourth material layer between the second conductive material layer and the second electrode, and the fourth material layer has a different material composition from the second conductive material layer and from the second electrode.

Example 74 includes the subject matter of Example 73, and further specifies that the fourth material layer has a same material composition as the third material layer.

Example 75 includes the subject matter of any of Examples 43-74, and further specifies that the first conductive material layer includes silver.

Example 76 includes the subject matter of any of Examples 43-74, and further specifies that the first conductive material layer includes copper, cobalt, or nickel.

Example 77 includes the subject matter of any of Examples 43-74, and further specifies that the first conductive material layer and the second conductive material layer have a same material composition.

Example 78 includes the subject matter of any of Examples 43-77, and further specifies that the dielectric material layer includes hafnium, tantalum, niobium, vanadium, or titanium.

Example 79 includes the subject matter of any of Examples 43-77, and further specifies that the dielectric material layer includes oxygen.

Example 80 includes the subject matter of any of Examples 43-77, and further specifies that the dielectric material layer includes a chalcogenide.

Example 81 includes the subject matter of any of Examples 43-77, and further specifies that the first electrode or the second electrode includes tantalum, platinum, hafnium, cobalt, indium, iridium, copper, or tungsten.

Example 82 includes the subject matter of any of Examples 43-81, and further includes: a dielectric barrier at a side surface of the selector device.

Example 83 includes the subject matter of Example 82, and further specifies that the dielectric barrier includes silicon and nitrogen.

Example 84 includes the subject matter of Example 82, and further specifies that the dielectric barrier includes aluminum and oxygen.

Example 85 includes the subject matter of any of Examples 82-84, and further specifies that the dielectric barrier has a thickness between 10 nanometers and 100 nanometers.

Example 86 is a selector device, including: a first electrode; a second electrode; and a selector material stack between the first electrode and the second electrode, wherein the selector material stack includes a dielectric material layer between a first conductive material layer and a second conductive material layer, the first conductive material layer is between the first electrode and the dielectric material layer, and the second conductive material layer is between the dielectric material layer and the second electrode; wherein the selector material stack further includes a first material layer between the first electrode and the first conductive material layer, the selector material stack further includes a second material layer between the second conductive material layer and the second electrode, the first material layer has a different material composition from the first electrode and from the first conductive material layer, and the second material layer has a different material composition from the second conductive material layer and from the second electrode.

Example 87 includes the subject matter of Example 86, and further specifies that the first material layer includes oxygen.

Example 88 includes the subject matter of Example 87, and further specifies that the first material layer further includes indium, ruthenium, tungsten, or molybdenum.

Example 89 includes the subject matter of Example 86, and further specifies that the first material layer includes nitrogen.

Example 90 includes the subject matter of Example 89, and further specifies that the first material layer further includes titanium, tantalum, or tungsten.

Example 91 includes the subject matter of Example 86, and further specifies that the first material layer includes carbon.

Example 92 includes the subject matter of Example 91, and further specifies that the first material layer further includes titanium, tantalum, tungsten, or a refractory metal.

Example 93 includes the subject matter of Example 91, and further specifies that the first material layer further includes nitrogen.

Example 94 includes the subject matter of Example 93, and further specifies that the first material layer further includes tantalum.

Example 95 includes the subject matter of Example 86, and further specifies that the first material layer includes tantalum.

Example 96 includes the subject matter of Example 95, and further specifies that the first material layer is a metal.

Example 97 includes the subject matter of any of Examples 86-96, and further specifies that the first material layer and the second material layer have a same material composition.

Example 98 includes the subject matter of any of Examples 86-96, and further specifies that the first material layer and the second material layer have a same thickness.

Example 99 includes the subject matter of any of Examples 86-98, and further specifies that the selector material stack further includes a third material layer between the first conductive material layer and the dielectric material layer, and the third material layer has a different material composition from the first conductive material layer and from the dielectric material layer.

Example 100 includes the subject matter of Example 99, and further specifies that the first material layer and the third material layer are diffusion barriers, and the third material layer is a weaker diffusion barrier than the first material layer.

Example 101 includes the subject matter of any of Examples 99-100, and further specifies that the third material layer has a thickness that is less than 3 nanometers.

Example 102 includes the subject matter of Example 101, and further specifies that the third material layer is tantalum.

Example 103 includes the subject matter of Example 101, and further specifies that the third material layer includes nitrogen.

Example 104 includes the subject matter of Example 103, and further specifies that the third material layer further includes titanium, tantalum, or tungsten.

Example 105 includes the subject matter of Example 101, and further specifies that the third material layer includes carbon.

Example 106 includes the subject matter of Example 105, and further specifies that the third material layer further includes titanium, tantalum, tungsten, or a refractory metal.

Example 107 includes the subject matter of Example 105, and further specifies that the third material layer further includes nitrogen.

Example 108 includes the subject matter of Example 107, and further specifies that the third material layer further includes tantalum.

Example 109 includes the subject matter of any of Examples 99-100, and further specifies that the third material layer includes titanium or aluminum.

Example 110 includes the subject matter of Example 109, and further specifies that the third material layer is a metal.

Example 111 includes the subject matter of any of Examples 99-100, and further specifies that a solubility of material of the first conductive material layer in material of the third material layer is between 1% and 30%.

Example 112 includes the subject matter of Example 111, and further specifies that a thickness of the third material layer is between 1 nanometer and 10 nanometers.

Example 113 includes the subject matter of any of Examples 99-100, and further specifies that the third material layer has a columnar microstructure.

Example 114 includes the subject matter of Example 113, and further specifies that the third material layer has a thickness between 5 nanometers and 100 nanometers.

Example 115 includes the subject matter of any of Examples 99-114, and further specifies that the selector material stack further includes a fourth material layer between the dielectric material layer and the second conductive material layer, and the fourth material layer has a different material composition from the dielectric material layer and from the second conductive material layer.

Example 116 includes the subject matter of Example 115, and further specifies that the fourth material layer has a same material composition as the third material layer.

Example 117 includes the subject matter of any of Examples 86-116, and further specifies that the first conductive material layer and the second conductive material layer have a same thickness.

Example 118 includes the subject matter of any of Examples 86-116, and further specifies that the first conductive material layer includes silver.

Example 119 includes the subject matter of any of Examples 86-116, and further specifies that the first conductive material layer includes copper, cobalt, or nickel.

Example 120 includes the subject matter of any of Examples 86-116, and further specifies that the first conductive material layer and the second conductive material layer have a same material composition.

Example 121 includes the subject matter of any of Examples 86-120, and further specifies that the dielectric material layer includes hafnium, tantalum, niobium, vanadium, or titanium.

Example 122 includes the subject matter of any of Examples 86-120, and further specifies that the dielectric material layer includes oxygen.

Example 123 includes the subject matter of any of Examples 86-120, and further specifies that the dielectric material layer includes a chalcogenide.

Example 124 includes the subject matter of any of Examples 86-120, and further specifies that the first electrode or the second electrode includes tantalum, platinum, hafnium, cobalt, indium, iridium, copper, or tungsten.

Example 125 includes the subject matter of any of Examples 86-124, and further includes: a dielectric barrier at a side surface of the selector device.

Example 126 includes the subject matter of Example 125, and further specifies that the dielectric barrier includes silicon and nitrogen.

Example 127 includes the subject matter of Example 125, and further specifies that the dielectric barrier includes aluminum and oxygen.

Example 128 includes the subject matter of any of Examples 125-127, and further specifies that the dielectric barrier has a thickness between 10 nanometers and 100 nanometers.

Example 129 is a memory cell, including: a storage element; and a selector device coupled to the storage element, wherein the selector device is the selector device of any of Examples 1-128.

Example 130 includes the subject matter of Example 129, the first electrode of the selector device or the second electrode of the selector device is also an electrode of the storage element.

Example 131 includes the subject matter of any of Examples 129-130, and further specifies that the storage element is a resistive random access memory (RRAM) device, a phase change memory (PCM) device, a metal filament memory device, or a magnetoresistive random access memory (MRAM) device.

Example 132 includes the subject matter of any of Examples 129-131, and further specifies that the memory cell includes a first terminal coupled to a bit line, and the memory cell includes a second terminal coupled to a word line.

Example 133 is a method of manufacturing an integrated circuit (IC) component, including: forming a first electrode; forming a selector material stack on the first electrode, wherein the selector material stack includes a metal, a dielectric material, and one or more barrier materials; and forming a second electrode on the selector material stack.

Example 134 includes the subject matter of Example 133, and further specifies that forming the selector material includes physical vapor deposition of at least a portion of the selector material stack.

Example 135 includes the subject matter of Example 133, and further specifies that forming the selector material includes atomic layer deposition of at least a portion of the selector material stack.

Example 136 includes the subject matter of any of Examples 133-135, and further includes: forming a storage element in series with the selector device.

Example 137 includes the subject matter of Example 136, and further specifies that the first electrode is shared with the storage element.

Example 138 includes the subject matter of Example 136, and further specifies that the second electrode is shared with the storage element.

Example 139 is a computing device, including: a circuit board; a processing device coupled to the circuit board; and a memory array coupled to the processing device, wherein the memory array includes a memory cell having a storage element coupled in series with a selector device, and the selector device is the selector device of any of Examples 1-128.

Example 140 includes the subject matter of Example 139, and further includes a wireless communications device coupled to the circuit board.

Example 141 includes the subject matter of any of Examples 139-140, and further specifies that the storage element includes a resistive switch.

Example 142 includes the subject matter of any of Examples 139-140, and further specifies that the storage element includes a resistive random access memory (RRAM) device, a phase change memory (PCM) device, a metal filament memory device, or a magnetoresistive random access memory (MRAM) device.

The invention claimed is:

1. A selector device, comprising:
a first electrode;
a second electrode; and
a selector material stack between the first electrode and the second electrode, wherein the selector material stack includes a dielectric material layer between a first conductive material layer and a second conductive material layer, the first conductive material layer is between the first electrode and the dielectric material layer, and the second conductive material layer is between the dielectric material layer and the second electrode;
wherein the selector material stack further includes a first material layer between the first electrode and the first conductive material layer, the selector material stack further includes a second material layer between the first conductive material layer and the dielectric material layer, the first material layer has a different material composition from the first electrode and from the first conductive material layer, and the second material layer has a different material composition from the first conductive material layer and from the dielectric material layer.

2. The selector device of claim 1, wherein the first material layer and the second material layer are diffusion barriers, and the second material layer is a weaker diffusion barrier than the first material layer.

3. The selector device of claim 1, wherein the first material layer includes oxygen.

4. The selector device of claim 3, wherein the first material layer further includes indium, ruthenium, tungsten, or molybdenum.

5. The selector device of claim 1, wherein the first material layer includes nitrogen.

6. The selector device of claim 5, wherein the first material layer further includes titanium, tantalum, or tungsten.

7. The selector device of claim 1, wherein the first material layer includes carbon.

8. The selector device of claim 7, wherein the first material layer further includes titanium, tantalum, tungsten, or a refractory metal.

9. The selector device of claim 7, wherein the first material layer further includes nitrogen.

10. The selector device of claim 1, wherein the first material layer includes tantalum.

11. The selector device of claim 1, wherein a solubility of material of the first conductive material layer in material of the second material layer is between 1% and 30%.

12. The selector device of claim 1, wherein the second material layer has a columnar microstructure.

13. The selector device of claim 1, wherein the dielectric material layer includes a chalcogenide.

14. The selector device of claim 1, wherein the selector material stack further includes:
a third material layer between the dielectric material layer and the second conductive material layer, and
a fourth material layer between the second conductive material layer and the second electrode,
wherein the third material layer has a different material composition from the dielectric material layer and from the second conductive material layer, and
wherein the fourth material layer has a different material composition from the second conductive material layer and from the second electrode.

15. The selector device of claim 1, further comprising:
a dielectric barrier at a side surface of the selector device.

16. The selector device of claim 15, wherein the dielectric barrier includes silicon and nitrogen.

17. The selector device of claim 15, wherein the dielectric barrier includes aluminum and oxygen.

18. The selector device of claim 15, wherein the dielectric barrier has a thickness between 10 nanometers and 100 nanometers.

19. A computing device, comprising:
a circuit board;
a processing device coupled to the circuit board; and
a memory array coupled to the processing device, the memory array comprising a memory cell having a storage element coupled in series with a selector device,
wherein the selector device includes:
a first electrode,
a second electrode, and
a selector material stack between the first electrode and the second electrode, wherein the selector material stack includes a dielectric material layer between a first conductive material layer and a second conductive material layer, the first conductive material layer is between the first electrode and the dielectric material layer, and the second conductive material layer is between the dielectric material layer and the second electrode,
wherein the selector material stack further includes a first material layer between the first electrode and the first conductive material layer, the selector material stack further includes a second material layer between the first conductive material layer and the dielectric material layer, the first material layer has a different material composition from the first electrode and from the first conductive material layer, and the second material layer has a different material composition from the first conductive material layer and from the dielectric material layer.

20. The computing device of claim 19, further comprising:
a wireless communications device coupled to the circuit board.

21. The computing device of claim 19, wherein the storage element includes a resistive switch.

22. The computing device of claim 19, wherein the storage element includes a resistive random access memory (RRAM) device, a phase change memory (PCM) device, a metal filament memory device, or a magnetoresistive random access memory (MRAM) device.

23. A method of manufacturing an integrated circuit (IC) component, the method comprising:
forming a selector device, including:
forming a first electrode;
forming a second electrode; and
forming a selector material stack between the first electrode and the second electrode, wherein the selector material stack includes a dielectric material layer between a first conductive material layer and a second conductive material layer, the first conductive material layer is between the first electrode and the dielectric material layer, and the second conductive material layer is between the dielectric material layer and the second electrode;
wherein the selector material stack further includes a first material layer between the first electrode and the first conductive material layer, the selector material stack further includes a second material layer between the first conductive material layer and the dielectric material layer, the first material layer has a different material composition from the first electrode and from the first conductive material layer, and the second material layer has a different material composition from the first conductive material layer and from the dielectric material layer.

24. The method of claim 23, further comprising:
forming a storage element in series with the selector device.

25. The method of claim 24, wherein the first electrode or the second electrode is shared with the storage element.

\* \* \* \* \*